US012666912B2

(12) United States Patent
Jin et al.

(10) Patent No.: US 12,666,912 B2
(45) Date of Patent: Jun. 23, 2026

(54) ARTICLE TRANSPORT SYSTEM AND METHOD OF OPERATING ARTICLE TRANSPORT SYSTEM

(71) Applicant: SEMES CO., LTD., Cheonan-si (KR)

(72) Inventors: Mei Xiang Jin, Suwon-si (KR); Sik Kim, Hwaseong-si (KR)

(73) Assignee: Semes Co., LTD., Cheonan-si (KR)

( * ) Notice: Subject to any disclaimer, the term of this patent is extended or adjusted under 35 U.S.C. 154(b) by 621 days.

(21) Appl. No.: 18/147,258

(22) Filed: Dec. 28, 2022

(65) Prior Publication Data

US 2023/0207364 A1 Jun. 29, 2023

(30) Foreign Application Priority Data

Dec. 28, 2021 (KR) ........................ 10-2021-0189974
Nov. 23, 2022 (KR) ........................ 10-2022-0158084

(51) Int. Cl.
*H10P 72/30* (2026.01)
*B66C 13/48* (2006.01)
*H10P 72/00* (2026.01)

(52) U.S. Cl.
CPC .......... *H10P 72/3216* (2026.01); *B66C 13/48* (2013.01); *H10P 72/0612* (2026.01); *H10P 72/3214* (2026.01); *H10P 72/3218* (2026.01); *H10P 72/3221* (2026.01)

(58) Field of Classification Search
CPC ......... H01L 21/67727; H01L 21/67276; H01L 21/67724; H01L 21/6773; H01L 21/67733; B66C 13/48
See application file for complete search history.

(56) References Cited

U.S. PATENT DOCUMENTS

| | | | | |
|---|---|---|---|---|
| 2001/0044788 A1* | 11/2001 | Demir | ................... | G06Q 10/02 |
| | | | | 705/418 |
| 2012/0078411 A1* | 3/2012 | Shimamura | ....... | H01L 21/67276 |
| | | | | 700/214 |
| 2018/0082873 A1* | 3/2018 | Ohmori | .................... | G06N 5/04 |
| 2020/0126830 A1* | 4/2020 | Dowling | .......... | H01L 21/67288 |

FOREIGN PATENT DOCUMENTS

| | | |
|---|---|---|
| JP | H11-102953 A | 4/1999 |
| JP | 2005-026421 A | 1/2005 |
| JP | 2007-141019 A | 6/2007 |
| JP | 2017-191361 A | 10/2017 |

(Continued)

OTHER PUBLICATIONS

Zhou, Victor, "A Simple Explanation of the Softmax Function" (Year: 2019).*

(Continued)

*Primary Examiner* — Ernesto A Suarez
*Assistant Examiner* — Laurence R Brothers
(74) *Attorney, Agent, or Firm* — Harness, Dickey & Pierce, P.L.C.

(57) ABSTRACT

A method of operating an article transport system includes deriving a predicted transport request time-point of a target apparatus from pre-collected operation data of the article transport system, calling a transport vehicle of the article transport system at a time-point prior to the derived predicted transport request time-point, and moving the called transport vehicle to the target apparatus.

20 Claims, 9 Drawing Sheets

(56) References Cited

FOREIGN PATENT DOCUMENTS

| | | | |
|---|---|---|---|
| JP | 2019-099522 A | | 6/2019 |
| JP | 2020194423 A | * | 12/2020 |
| KR | 2004-0072273 A | | 8/2004 |
| KR | 101029258 B1 | | 4/2011 |
| WO | WO-2007132651 A1 | * | 11/2007 .............. G05D 1/02 |

OTHER PUBLICATIONS

JP-2020194423-A (Year: 2020).*
WO-2007132651-A1 (Year: 2007).*

* cited by examiner

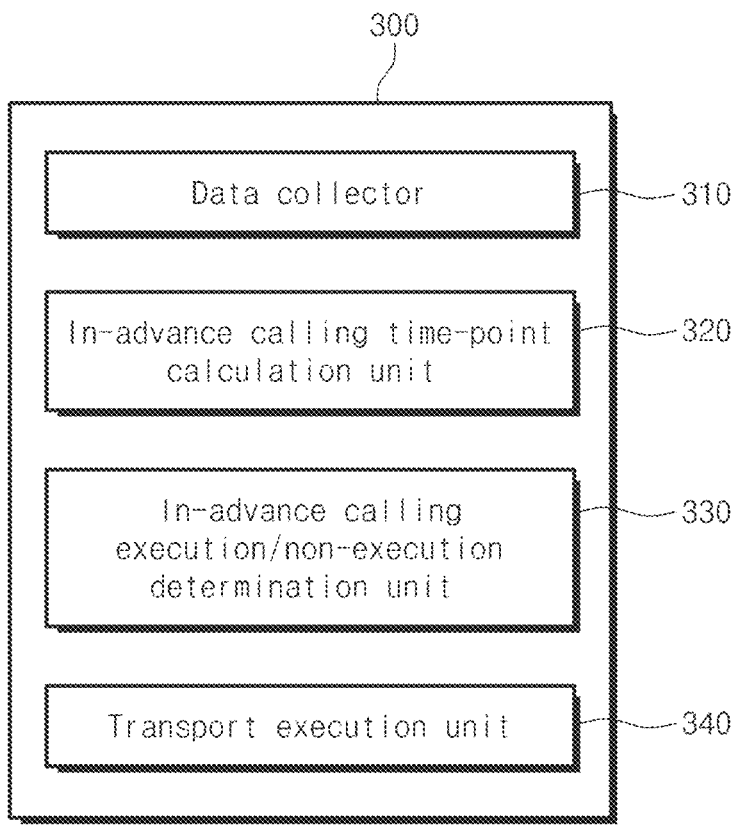

Data collector ——310

In-advance calling time-point
calculation unit ——320

In-advance calling
execution/non-execution
determination unit ——330

Transport execution unit ——340

FIG. 5

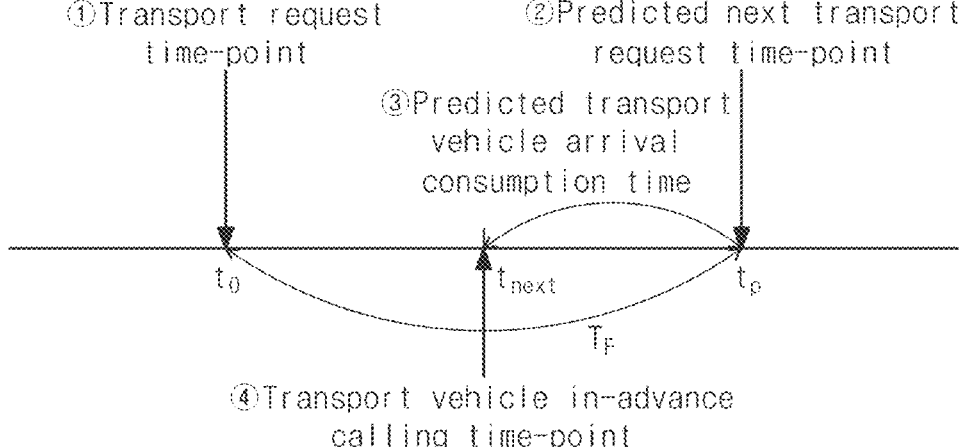

①Transport request
time-point

②Predicted next transport
request time-point

③Predicted transport
vehicle arrival
consumption time $t_0$          $t_{next}$          $t_p$ $T_F$ ④Transport vehicle in-advance
calling time-point

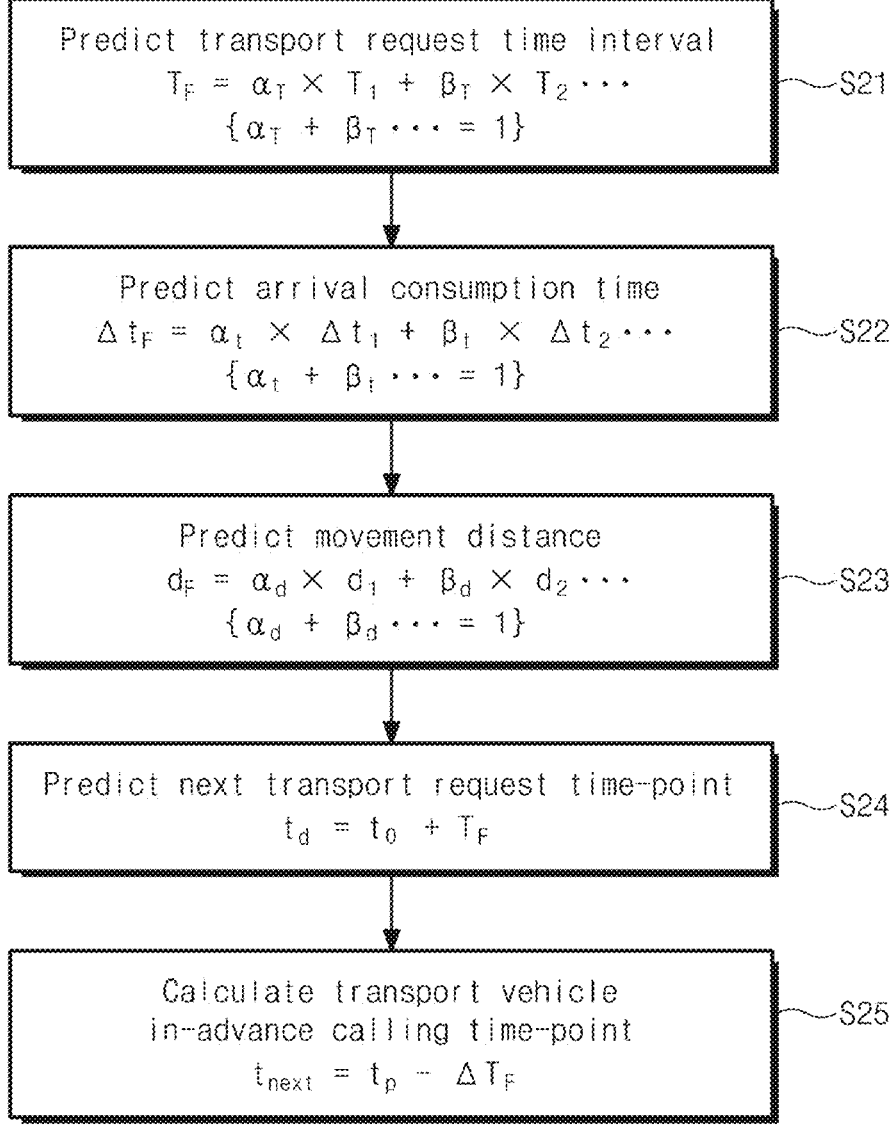

Predict transport request time interval
$$T_F = \alpha_T \times T_1 + \beta_T \times T_2 \cdots$$
$$\{\alpha_T + \beta_T \cdots = 1\}$$
~S21

Predict arrival consumption time
$$\Delta t_F = \alpha_t \times \Delta t_1 + \beta_t \times \Delta t_2 \cdots$$
$$\{\alpha_t + \beta_t \cdots = 1\}$$
~S22

Predict movement distance
$$d_F = \alpha_d \times d_1 + \beta_d \times d_2 \cdots$$
$$\{\alpha_d + \beta_d \cdots = 1\}$$
~S23

Predict next transport request time-point
$$t_d = t_0 + T_F$$
~S24

Calculate transport vehicle
in-advance calling time-point
$$t_{next} = t_p - \Delta T_F$$
~S25

BM

ARTICLE TRANSPORT SYSTEM AND METHOD OF OPERATING ARTICLE TRANSPORT SYSTEM

CROSS-REFERENCE TO RELATED APPLICATIONS

A claim for priority under 35 U.S.C. § 119 is made to Korean Patent Application No. 10-2021-0189974 filed on Dec. 28, 2021 and Korean Patent Application No. 10-2022-0158084 filed on Nov. 23, 2022, in the Korean Intellectual Property Office, the entire contents of which are hereby incorporated by reference.

BACKGROUND

Embodiments of the inventive concept described herein relate to an article transport system and a method of operating the article transport system.

In order to manufacture a semiconductor device, various processes such as photography, etching, ashing, ion implantation, and thin film deposition are performed on a substrate such as a wafer. A substrate treatment apparatus (semiconductor equipment) that may perform each of the processes may be placed in a semiconductor manufacturing line. The semiconductor manufacturing line is provided with transport vehicles that transport articles. For example, in the semiconductor manufacturing line, an over head transport (OHT) that travels along a rail installed on a ceiling of the semiconductor manufacturing line, and an auto vehicle robot (AVR) that autonomously travels along a floor of the semiconductor manufacturing line may be provided. The OHT and AVR transport articles necessary to perform the process. The article required to perform the process may be a substrate such as a wafer or glass as a subject to be treated, or a process kit such as a mask or a focus ring used in the process.

The semiconductor manufacturing line includes a control device for controlling a transport vehicle such as the OHT. The control device may collect driving information, such as the transport vehicle's a travel speed, the transport vehicle's a travel direction, and a transport destination to which the transport vehicle transports the article. Further, the control device may generate a control signal to control the transport vehicles.

A general method of operating a transport system is described. First, when the article is required in the substrate treatment apparatus, the substrate treatment apparatus generates an article transport request signal. For example, when the substrate treatment apparatus completes treatment on received wafers, the substrate treatment apparatus generates an article transport request signal requesting transport of untreated wafers. The article transport request signal is transmitted to the control device that controls components of the transport system via wired/wireless communication. When the control device receives the article transport request signal, the control device adds identification information on the substrate treatment apparatus that has generated the article transport request signal (the identification information includes location information of the substrate treatment apparatus), and information about a type of the article as required, and the number of the required articles to a task list. That is, transport tasks that the transport system needs to transport are listed in the task list. Thereafter, the control device searches for a transport vehicle capable of performing the corresponding transport task, and assigns the transport task to a transport vehicle suitable for performing the task among the found transport vehicles. The transport vehicle to which the task has been assigned performs transport.

However, in this operation method, the transport task is added to the list after the transport request occurs from the substrate treatment apparatus. In other words, the control of the transport vehicles of the transport system is performed only after the transport request from the substrate treatment apparatus has occurred. Therefore, the general method of operating the transport system is non-proactive and is passive. Further, the general method of operating the transport system has limitations in reducing a time required for the transport vehicle to arrive at the substrate treatment apparatus after reception of the transport request.

SUMMARY

Embodiments of the inventive concept provide an article transport system capable of effectively transporting an article and a method for operating the article transport system.

Further, embodiments of the inventive concept provide an article transport system capable of reducing a time required for article transport and a method for operating the article transport system.

Further, embodiments of the inventive concept provide an article transport system capable of predicting a transport request time-point of a target apparatus and thus proactively and actively controlling a transport vehicle in article transport, and a method for operating the article transport system.

Further, embodiments of the inventive concept provide an article transport system capable of minimizing a time required for article transport to improve an operation time of a target apparatus, and a method for operating the article transport system.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

The inventive concept provides a method of operating an article transport system. The method of operating the article transport system includes deriving a predicted transport request time-point of a target apparatus from pre-collected operation data of the article transport system, calling a transport vehicle of the article transport system at a time-point prior to the derived predicted transport request time-point, and moving the called transport vehicle to the target apparatus.

According to one embodiment, the method may include deriving a predicted arrival consumption time required for the transport vehicle to arrive at the target apparatus, based on the operation data, in calling the transport vehicle, and deriving a transport vehicle in-advance calling time-point at which the calling of the transport vehicle may be performed, based on the derived predicted transport request time-point and the derived predicted arrival consumption time.

According to one embodiment, the transport vehicle in-advance calling time-point may be equal to or earlier than a time-point obtained by subtracting the predicted arrival consumption time from the predicted transport request time-point.

According to one embodiment, the method may include collecting data while the article transport system operates for a set period, wherein the collected data may include: a) a transport request time-interval of the target apparatus, b) an arrival consumption time required for the transport vehicle to arrive at the target apparatus in calling the transport vehicle, and/or c) a movement distance by which the transport vehicle moves to the target apparatus in calling the transport vehicle.

According to one embodiment, the method may include adding representative values of the collected data to the operation data.

According to one embodiment, the method may include applying a weight to each of the representative values stored in the operation data to derive the predicted transport request time-interval, the predicted arrival consumption time, and/or the predicted movement distance of the transport vehicle.

According to one embodiment, a larger magnitude of the weight may be applied to the representative value more recently added to the operation data.

According to one embodiment, a sum of the weights may be 1.

Further, the inventive concept provides a method of operating an article transport system. The article transport system includes a rail installed above substrate treatment apparatuses, and transport vehicles traveling along the rail and transporting an article to the substrate treatment apparatus. The method includes a data collection step for collecting operation data while the article transport system operates, and an in-advance calling time-point calculation step including deriving a predicted transport request time-point of the substrate treatment apparatus, based on the operation data, and deriving an in-advance calling time-point of the transport vehicle, wherein the in-advance calling time-point may be earlier than the derived predicted transport request time-point.

According to one embodiment, the in-advance calling time-point calculation step may include deriving a predicted transport time-interval of the substrate treatment apparatus based on the operation data, and deriving the predicted transport request time-point by adding the predicted transport time-interval to an actual transport request time-point.

According to one embodiment, the in-advance calling time-point calculation step may include deriving, based on the operation data, a predicted arrival consumption time required for the transport vehicle to arrive at the substrate treatment apparatus, and/or a predicted movement distance by which the transport vehicle moves to arrive at the substrate treatment apparatus, and designating, as the in-advance calling time-point, a time-point equal to or earlier than a time-point obtained by subtracting the predicted arrival consumption time from the predicted transport request time-point.

According to one embodiment, the method may further include an in-advance calling execution/non-execution determination step for determining whether the designated in-advance calling time-point has passed a current time-point, and determining whether to proceed with in-advance calling of the transport vehicle based on the determining result.

According to one embodiment, the method may further include a transport step for transporting the article using a transport model selected from among a first transport model and a second transport model based on the determination result in the in-advance calling execution/non-execution determination step, wherein the second transport model may be different from the first transport model.

According to one embodiment, when the designated in-advance calling time-point does not pass the current time-point, the transport step may be performed based on the first transport model, wherein the first transport model may be configured to select one of the transport vehicles and measure a distance between the selected transport vehicle and the substrate treatment apparatus, and determine whether the selected transport vehicle can be reserved, based on the measured distance.

According to one embodiment, the first transport model may be further configured to determine whether the transport vehicle can be reserved, based on a ratio between the measured distance and the predicted movement distance.

According to one embodiment, the first transport model may be further configured to: when an actual transport request of the substrate treatment apparatus occurs while the reserved transport vehicle may be moving to the substrate treatment apparatus, confirm the reservation of the transport vehicle and perform transport using the transport vehicle.

According to one embodiment, the first transport model may be further configured to: when an actual transport request of the substrate treatment apparatus does not occur while the reserved transport vehicle may be moving to the substrate treatment apparatus, allow the reserved transport vehicle to wait at a position above the substrate treatment apparatus.

According to one embodiment, the method may include applying the second transport model to call another transport vehicle when collision avoidance of the transport vehicle may be required while the transport vehicle may be waiting at the position above the substrate treatment apparatus.

According to one embodiment, the second transport model may be configured to allow the substrate treatment apparatus to generate an actual transport request, search for the transport vehicle capable of performing the actual transport request of the substrate treatment apparatus, allow a control device to assign a task to the found transport vehicle, and allow the transport vehicle to which the control device has assigned the task to perform transport.

Further, the inventive concept provides an article transport system for transporting an article to a semiconductor manufacturing line, wherein the article transport system includes a rail installed above substrate treatment apparatuses, transport vehicles traveling along the rail and transporting the article to the substrate treatment apparatus, and a control device configured to control travel of the transport vehicles, wherein the control device includes a data collector for collecting operation data obtained while the transport vehicles transport the article to the substrate treatment apparatuses, an in-advance calling time-point calculation unit for deriving a predicted transport request time-point of the substrate treatment apparatus, based on the operation data, and deriving an in-advance calling time-point of a first transport vehicle among the transport vehicles, wherein the in-advance calling time-point may be prior to the derived predicted transport time-point, an in-advance calling execution/non-execution determination unit for determining whether the derived in-advance calling time-point has passed a current time-point, and determining whether to proceed with in-advance calling of the first transport vehicle, based on the determining result, and a transport execution unit for transmitting a control signal to the transport vehicle such that when the in-advance calling execution/non-execution determination unit determines to proceed with the in-advance calling, the transport vehicle transports the article based on a first transport model, or when the in-advance calling execution/non-execution determination unit determines not to proceed with the in-advance calling, the transport vehicle transports the article based on a second transport model different from the first transport model.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 4 is a block diagram schematically showing a control device of FIG. 1;

FIG. 5 is an illustrative diagram schematically showing a prediction model of an operation method according to one embodiment of the inventive concept;

FIG. 8 is a flow chart for illustrating an in-advance calling time-point calculation step of FIG. 6;

DETAILED DESCRIPTION

Hereinafter, with reference to the accompanying drawings, an embodiment of the inventive concept will be described in detail so that a person having ordinary knowledge in the technical field to which the inventive concept belongs may easily practice the same. However, the inventive concept may be implemented in many different forms and is not limited to the embodiments described herein. Further, in describing the preferred embodiment of the inventive concept in detail, when it is determined that a detailed description of a related known function or component may unnecessarily obscure the gist of the inventive concept, the detailed description is omitted. Further, components with similar functions and action are given the same reference numbers throughout the drawings.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An article transport system as described below may be a system for transporting an article on a manufacturing line for manufacturing a semiconductor device and/or a flat panel display panel. The article transport system as described below may be a system that transports articles such as process kits such as wafers, masks, glasses, and focus rings. The articles may be transported while being received in a container that may be a cassette, a FOUP, a pod, a magazine, or a tray.

Hereinafter, an example in which a transport vehicle is an overhead transport that travels along a rail installed on a ceiling of a semiconductor manufacturing line is described. Further, hereinafter, an example in which the article transport system stores a substrate such as a wafer in the FOUP and transports the substrate stored in the FOUP is described. Further, in a following description, an example in which a target apparatus to which the transport vehicle transports the article is a substrate treatment apparatus which performs a semiconductor device manufacturing process such as photolithography, etching, ashing, ion implantation, and thin film deposition on the substrate is described.

Figure 1:
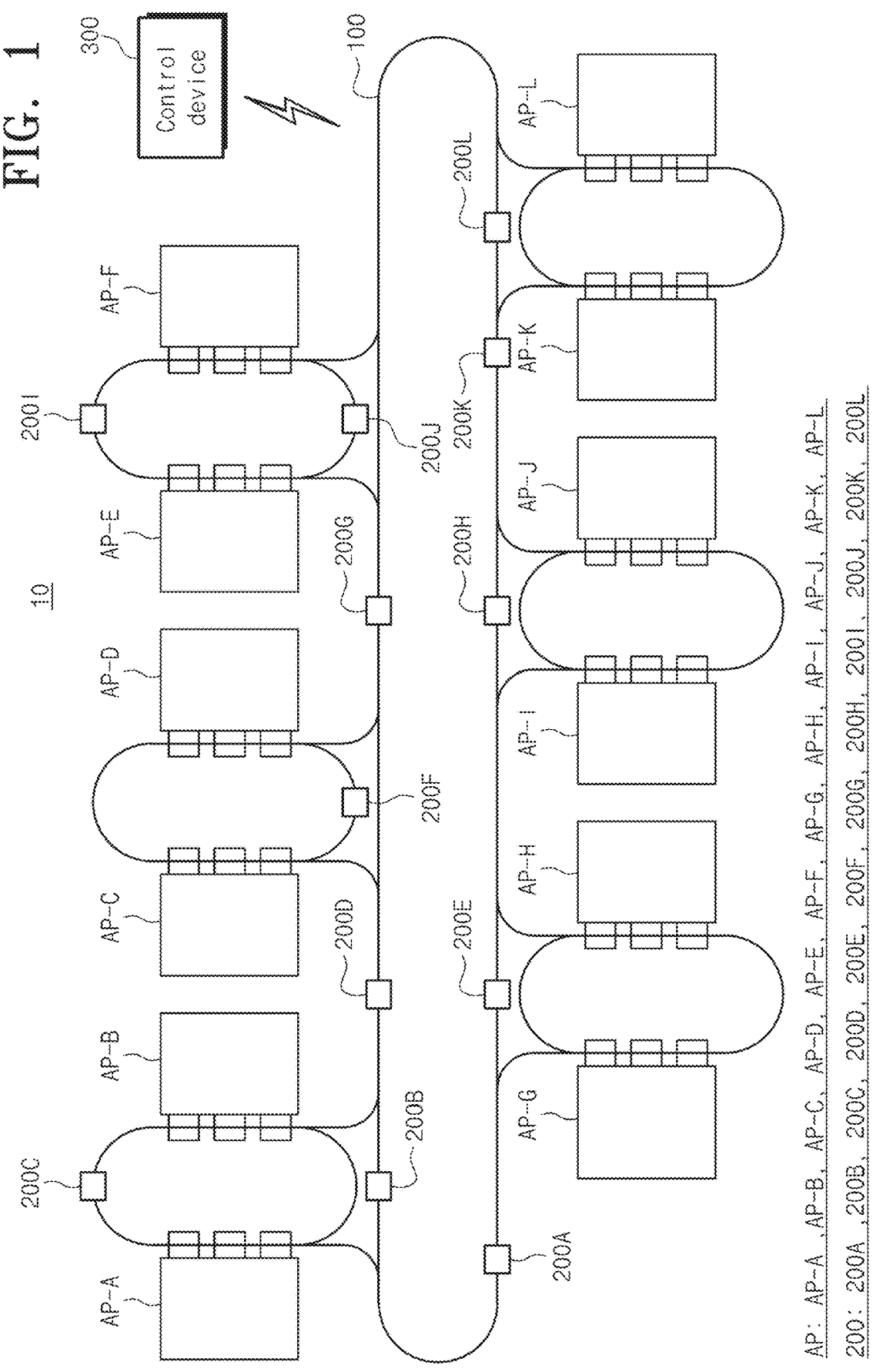
FIG. 1 is an illustrative diagram schematically showing an article transport system according to one embodiment of the inventive concept.

FIG. 1 is an illustrative diagram schematically showing an article transport system according to one embodiment of the inventive concept.

Referring to FIG. 1, an article transport system 10 according to an embodiment of the inventive concept may transport an article to a substrate treatment apparatus AP as a target apparatus to which the article is to be transported. A plurality of substrate treatment apparatuses AP may be disposed in the semiconductor manufacturing line. For example, a first substrate treatment apparatus AP-A to a twelfth substrate treatment apparatus AP-L may be disposed in the semiconductor manufacturing line. However, this is just an example, and a larger number of the substrate treatment apparatuses AP may be disposed in the semiconductor manufacturing line.

The article transport system 10 may include a rail 100, a transport vehicle 200, and a control device 300.

The rail 100 may be installed on a ceiling of the semiconductor manufacturing line. The rail 100 may be installed in a suspended manner via a metal suspension rod on the ceiling of the semiconductor manufacturing line. The rail 100 may be installed on the ceiling of the semiconductor manufacturing line, and may be installed so that the transport vehicle 200 may pass through a space above the substrate treatment apparatus AP. For example, in a top view of the substrate treatment apparatus AP, the rail 100 may be installed to overlap a load port of the substrate treatment apparatus AP. The load port may be a unit constituting a component of the substrate treatment apparatus AP which a container transported by the transport vehicle 200 may be loaded or unloaded into or from. The load port may be configured such that the container transported by the transport vehicle 200 may be seated thereon. When the container is placed on the load port, the article stored in the container, such as substrates such as wafers may be transported into the substrate treatment apparatus AP. A treatment process may be performed on the substrates transported into the substrate treatment apparatus AP.

The transport vehicle 200 may travel along the rail 100. The article transport system 10 may have a plurality of transport vehicles 200. For example, the article transport system 10 may have a first transport vehicle 200A to a twelfth transport vehicle 200L. However, this is just an example, and the article transport system 10 may include a larger number of the transport vehicles 200.

The transport vehicle 200 may transport the article while traveling along the rail 100. The transport vehicle 200 may receive a control signal from the control device 300 to be described later and transport the article based on the control signal. The transport vehicle 200 may receive a transport task related to article transport from the control device 300 to be described later and transport the article to the substrate treatment apparatus AP based on the transport task. Further, the transport vehicle 200 transporting the article should be interpreted as a concept including not only bringing the article to the substrate treatment apparatus AP, but also collecting the article from the substrate treatment apparatus AP.

Figure 2:
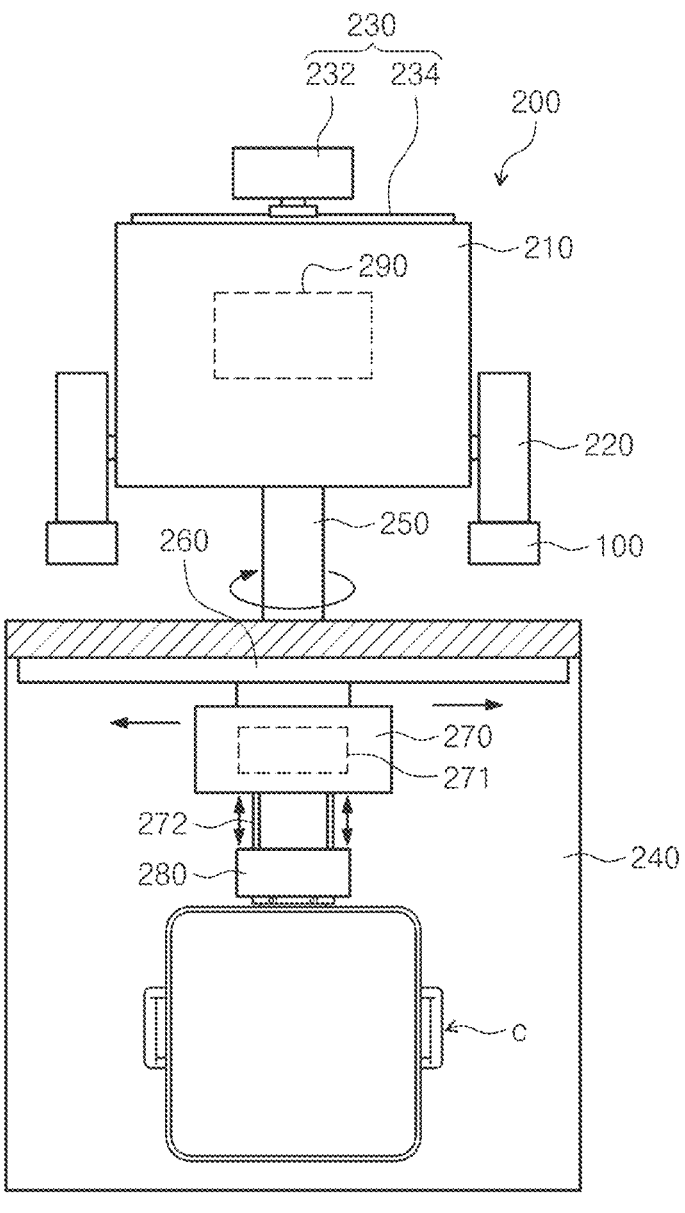
FIG. 2 is a front cross-sectional view of a transport vehicle of FIG. 1.
Figure 3:
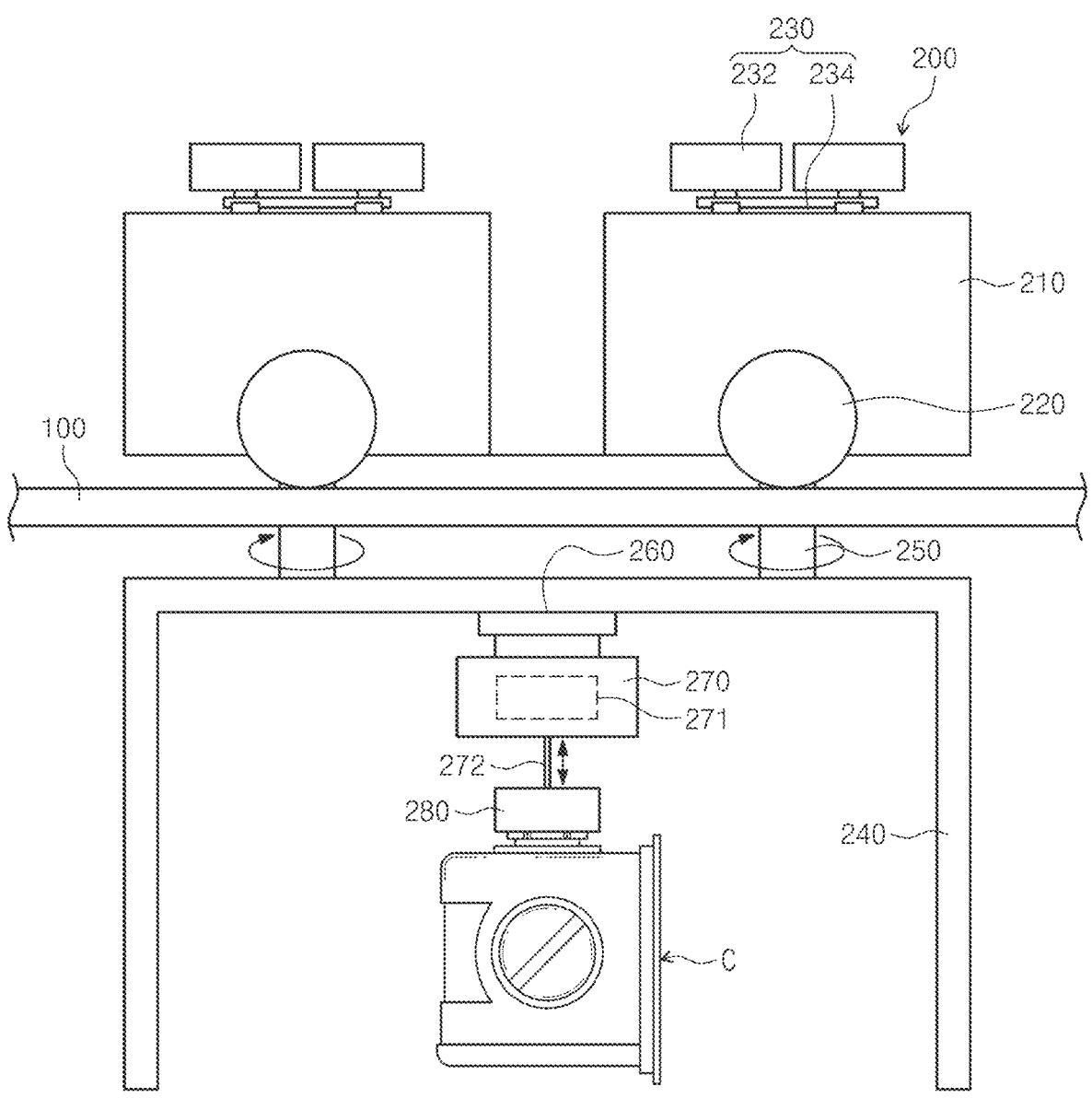
FIG. 3 is a side cross-sectional view of the transport vehicle of FIG. 1.

FIG. 2 is a front cross-sectional view of the transport vehicle of FIG. 1, and FIG. 3 is a side cross-sectional view of the transport vehicle of FIG. 1.

Referring to FIG. 1 to FIG. 3, the transport vehicle 200 according to one embodiment of the inventive concept may be configured to be able to travel along the travel guide rail 100 as described above. The transport vehicle 200 may be configured to grip a container C. The transport vehicle 200 may be configured to travel on and along the rail 100 while gripping the container C. The transport vehicle 200 may include a body 210, a rotatable wheel 220, a steering mechanism 230, a frame 240, a neck 250, a slider 260, a vertical movement mechanism 270, a grip mechanism 280, and a control unit 290.

The rotatable wheel 220, the steering mechanism 230, and the neck 250 may be coupled to the body 210. The rotatable wheel 220 may be rotatably coupled to the body 210. Further, the body 210 may be equipped with a travel driver(not shown) which rotates the rotatable wheel 220. Further, the body 210 may include the control unit 290 that controls an operation of the transport vehicle 200. Further, the steering mechanism 230 may be provided on a top face of the body 210. Further, the neck 250 may be rotatably coupled to the body 210.

The travel driver 211 may transmit power to the rotatable wheel 220 to rotate the rotatable wheel 220. Further, the body 210 may include a plurality of bodies.

Each of the bodies 210 may have the aforementioned travel driver 211. Further, the rotatable wheel 220, the steering mechanism 230, and the neck 250 as described above may be coupled to each of the bodies 210.

The rotatable wheel 220 may be rotatably coupled to the body 210. The rotatable wheel 220 may be rotated upon receiving the power from the travel driver 211. The rotatable wheel 220 may rotate while being in contact with the travel guide rail 100. The rotatable wheel 220 may be coupled to the body 210. The rotatable wheel 220 may be rotatably coupled to the body 210. The rotatable wheel 220 may be in contact with the travel guide rail 100 and may rotate and thus may travel along the travel guide rail 100. A plurality of rotatable wheel 220 may be provided. The rotatable wheel 220 may be provided as a pair. One of the rotatable wheels 220 may be rotatably coupled to one face of the body 210, and the other of the rotatable wheels 220 may be rotatably coupled to the other face opposite to one face of the body 210.

The steering mechanism 230 may be installed on a top of the body 210. The steering mechanism 230 may include a plurality of steering wheels 232 and a steering rail 234. The steering wheel 232 may be positioned along a direction parallel to a driving direction of the transport vehicle 200 in a top view. Further, the steering rail 234 may have a longitudinal direction parallel to a direction perpendicular to the driving direction of the transport vehicle 200 in the top view. Further, a position of the steering wheel 232 may be changed along the longitudinal direction of the steering rail 234.

The frame 240 may have an inner space. The slider 260, the vertical movement mechanism 270, and the grip mechanism 280 to be described later may be provided in the inner space of the frame 240. Further, the frame 240 may have a hexahedral shape with both opposing sides and a bottom being open. That is, front and rear faces of the frame 240 may be embodied as blocking plates. This may prevent shaking of the held container C due to air resistance when the transport vehicle 200 travels. Further, the frame 240 may be joined to the body 210 via the neck 250. The neck 250 may be rotatable with respect to the body 210 and the frame 240. The frame 240 may be coupled to at least one or more bodies 210 via at least one or more necks 250. For example, one frame 240 may be provided, and two necks 250 may be coupled to one frame 240. Alternatively, the two necks 250 may be coupled to different bodies 210, respectively.

The slider 260 may be coupled to the frame 240. The slider 260 may change a position of the vertical movement mechanism 270. The slider 260 may move the vertical movement mechanism 270 in a direction perpendicular to the driving direction of the transport vehicle 200. That is, the slider 260 may change a position of the container C gripped by the grip mechanism 280 toward left and right sides around the driving direction of the transport vehicle 200.

The vertical movement mechanism 270 may be provided between the body 210 and the grip mechanism 280. The vertical movement mechanism 270 may move the grip mechanism 280 in the vertical direction. The vertical movement mechanism 270 may raise or lower the grip mechanism 280. The vertical movement mechanism 270 may include a vertical movement driver 271 and a belt 272. The vertical movement mechanism 270 may be referred to as a hoist device. The vertical movement driver 271 may wind or unwind the belt 272 to change a length of the suspended belt 272. For example, when the vertical movement driver 271 unwinds the belt 272, the length of the belt 272 becomes larger. When the vertical movement driver 271 winds the belt 272, the length of the belt 272 may be shortened. Further, the belt 272 may include a plurality of belts. One end of each of the plurality of belts 272 may be connected to the grip mechanism 280.

The grip mechanism 280 may grip the container C. When the grip mechanism 280 is closed, the grip mechanism 280 may grip the container C. When the grip mechanism 280 is opened, the grip mechanism 280 may place the container C. That is, the grip mechanism 280 may detachably grip the container C. The grip mechanism 280 may unload the container C from the load port of the substrate treatment apparatus AP.

The control unit 290 may be provided in the body 210 as described above. The control unit 290 may be provided in the inner space of the body 210. The control unit 290 may control at least one or more of components of the transport vehicle 200, for example, the travel driver 211, the vertical movement driver 271, and the slider 260. The control unit 290 may include a processor capable of generating a control signal capable of controlling the travel driver 211, the vertical movement driver 271, and the slider 260. The processor may be composed of one or more processing circuits for calculation and signal processing.

Further, the control unit 290 may include a wireless LAN card to enable wireless communication with the control device 300 to be described later. The control unit 290 may transmit, to the control device 300, data including a traveling speed and a traveling direction of the transport vehicle 200, a transport destination thereof, a current location of the transport vehicle 200, a distance between the transport vehicle 200 and the transport destination, and an arrival consumption time required for the transport vehicle 200 to reach the transport destination, a type of a transported article, the number of transported articles, etc.

Referring back to FIG. 1, the control device 300 may control the article transport system 10. The control device 300 may control the transport vehicle 200. The control device 300 may control the transport vehicles 200. The control device 300 may control the transport vehicles 200 to transport the container containing therein the article to the substrate treatment apparatuses AP disposed in the semiconductor manufacturing line. The control device 300 may control the driving of the transport vehicle 200. The control device 300 may transmit a control signal (command) for controlling the transport vehicles 200 to the transport vehicle 200. The control device 300 may be connected to the transport vehicle 200 in a wireless communication manner. According to the control signal (command) of the control device 300, the transport vehicles 200 may transfer the article from a departure location instructed by the control device 300 to the destination location instructed by the control device 300. The control device 300 may be an overhead transport control system (OCS).

The control device 300 includes a process controller composed of a microprocessor (computer) that controls the components of the article transport system 10, a user interface composed of a keyboard through which an operator inputs a command to manage the article transport system 10, and a display that visualizes and displays operation status of the substrate treatment apparatus, and a storage medium storing therein a control program for executing processing executed in the article transport system 10 under control of a process controller. Further, the user interface and the storage medium may be connected to the process controller. The storage medium may be a hard disk, or may be a portable disk such as a CD-ROM or DVD, or a semiconductor memory such as a flash memory.

FIG. 4 is a schematic block diagram of the control device in FIG. 1.

Referring to FIG. 1 and FIG. 4, functional components of the control device 300 will be described. The control device 300 may include a data collector 310, an in-advance calling time-point calculation unit 320, an in-advance calling execution/non-execution determination unit 330, and a transport execution unit 340. The data collector 310 may collect operation data obtained by the transport vehicles 200 while the transport vehicles 200 travel along the rail 100 and transport the article to the substrate treatment apparatuses AP. That is, the data collector 310 may perform data collection step S10 to be described later.

The in-advance calling time-point calculation unit 320 may derive a predicted transport request time-point of the substrate treatment apparatus AP, based on the operation data collected by the data collector 310, and may derive an in-advance calling time-point at which in-advance calling of any one of the transport vehicles 200, for example, the first transport vehicle AP-A is to be executed, prior to the derived predicted transport time-point. That is, the in-advance calling time-point calculation unit 320 may perform in-advance calling time-point calculation step S20 to be described later.

The in-advance calling execution/non-execution determination unit 330 may determine whether the in-advance calling time-point derived in the in-advance calling time-point calculation step S20 has passed a current time-point, and may determine whether to proceed with the in-advance calling of any one of the transport vehicle APs, for example, the first transport vehicle AP-A, based on the determination result. That is, the in-advance calling execution/non-execution determination unit 330 may perform in-advance calling execution/non-execution determination step S30 to be described later.

The transport execution unit 340 may store therein a first transport model PM and a second transport model BM, which will be described later. The first transport model PM and the second transport model BM may be preset algorithms. The first transport model PM and the second transport model BM may be different transport algorithms. When the in-advance calling execution/non-execution determination unit 330 determines to proceed with the in-advance calling, the transport execution unit 340 may operate the article transport system 10, based on the first transport model PM. When the in-advance calling execution/non-execution determination unit 330 determines not to proceed with the in-advance calling, the transport execution unit 340 may operate the article transport system 10, based on the second transport model BM. That is, the transport execution unit 340 may transmit, to the transport vehicle 200, a control signal based on whether to proceed with the in-advance calling. The transport execution unit 340 may perform transport step S40 as described later.

FIG. 5 is an illustrative diagram schematically showing a prediction model of an operation method according to one embodiment of the inventive concept.

Referring to FIG. 1 and FIG. 5, in general, assigning a task to transport an article to the transport vehicle 200 includes, first generating, by the substrate treatment apparatus AP, a transport request signal requesting transport of the article, and then, searching, by the control device 300, for the transport vehicle 200 capable of performing a task corresponding to the transport request signal. Then, the control device 300 assigns the task to the found transport vehicle 200. The transport vehicle 200 to which the task is assigned transports the article to the substrate treatment apparatus AP. However, this scheme has a limitation in reducing an article transport time because the task assignment is made to the transport vehicle 200 after the transport request signal of the substrate treatment apparatus AP is generated.

Accordingly, according to one embodiment of the inventive concept, a prediction model is applied to the article transport system 10 as shown in FIG. 5, and the article is transported based on the applying result thereof.

The substrate treatment apparatus AP generally repeatedly performs the same treatment process. Therefore, a transport request time-point at which the substrate treatment apparatus AP requests article transport is also repeated. Because the substrate treatment apparatus AP repeatedly performs the same process, the transport request time-points are somewhat regular. That is, via statistical processing of operation data obtained by operating the article transport system 10, a transport request time-interval $T_F$ of the substrate treatment apparatus AP may be predicted at high probability. When the transport request time-interval $T_F$ may be predicted, a predicted transport request time-point $t_P$ which is predicted as a next transport request time-point after a transport request time-point $t_0$ may be derived.

Further, from the operation data obtained by operating the article transport system 10, an arrival consumption time required for the transport vehicle 200 arrives at the substrate treatment apparatus AP that has generated the transport request may be predicted at high probability. When the predicted arrival consumption time of the transport vehicle 200 and the predicted transport request time-point $t_P$ may be derived, an in-advance calling time-point $t_{next}$ of the transport vehicle 200 may be derived. The in-advance calling time-point $t_{next}$ may be a time point between the transport request time-point $t_0$ at which the actual transport request has occurred and the predicted transport request time-point $t_P$. When the transport vehicle 200 is called in-advance at the in-advance calling time-point $t_{next}$, the transport vehicle 200 may arrive at the substrate treatment apparatus AP at the predicted transport request time-point $t_P$ predicted as the next transport request time-point at high probability.

Hereinafter, a method of operating the article transport system 10 to which the prediction model as described in FIG. 5 is applied is described in more detail.

Figure 6:
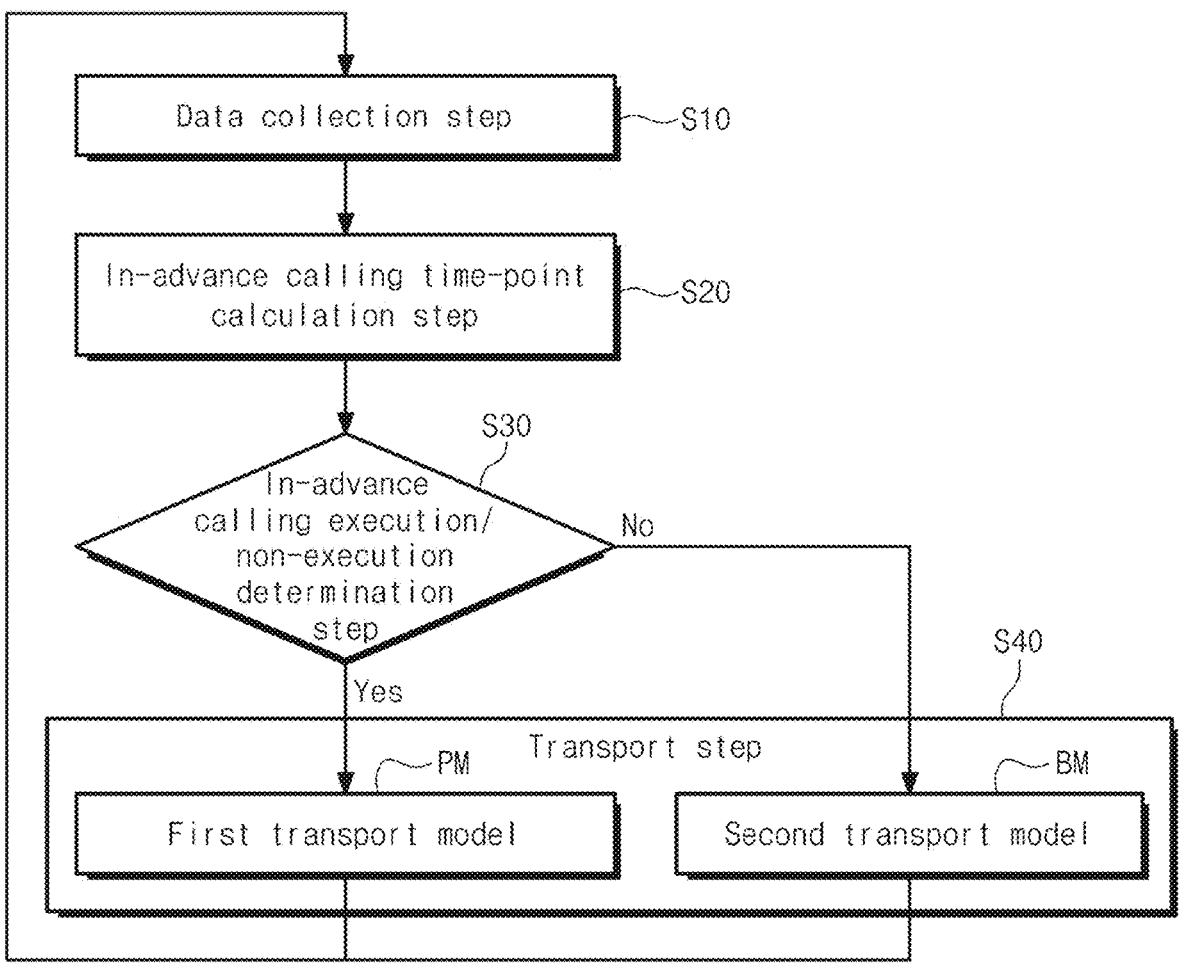
FIG. 6 is a flow chart schematically illustrating an operation method according to one embodiment of the inventive concept.

FIG. 6 is a flow chart schematically illustrating an operation method according to one embodiment of the inventive concept.

Referring to FIG. 1 and FIG. 6, the method for operating the article transport system 10 according to one embodiment of the inventive concept may include data collection step S10, in-advance calling time-point calculation step S20, in-advance calling execution/non-execution determination step S30 and transport step S40. Data collection step S10, in-advance calling time-point calculation step S20, in-advance calling execution/non-execution determination step S30, and transport step S40 may be sequentially performed. Data collection step S10, in-advance calling time-point calculation step S20, in-advance calling execution/non-execution determination step S30, and transport step S40 may be performed by the control device 300 as described above.

Figure 7:
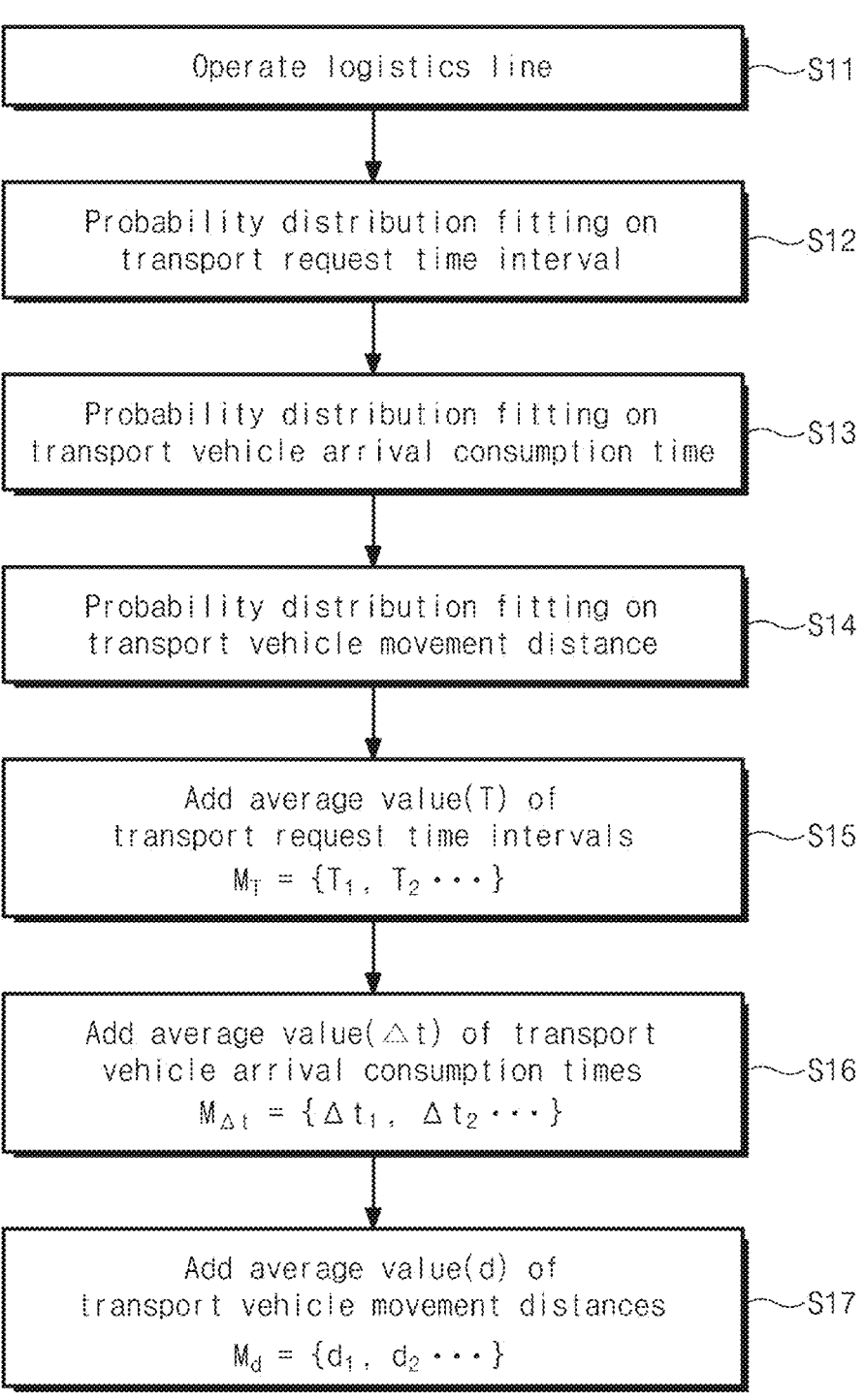
FIG. 7 is a flow chart for illustrating a data collection step of FIG. 6.

FIG. 7 is a flow chart for illustrating the data collection step of FIG. 6.

Referring to FIG. 1, FIG. 6 and FIG. 7, in step S11, a logistics line is operated. Operating the logistics line may mean delivering an article to a target apparatus, for example, the substrate treatment apparatus AP using the article transport system 10, and collecting the article from the substrate treatment apparatus AP. As described above, when the article transport system 10 is operated, various data may be collected.

The data may include a transport request time-interval by which the substrate treatment apparatus AP requests transport of an article, a time taken for the transport vehicle 200 to reach the substrate treatment apparatus AP when the control device 300 calls the transport vehicle 200 based on the transport request of the substrate treatment apparatus AP, and a movement distance by which the transport vehicle 200 moves to the substrate treatment apparatus AP when the control device 300 calls the transport vehicle 200.

For example, the first substrate treatment apparatus AP-A among the substrate treatment apparatuses AP may repeatedly request the article transport at the transport request time-interval of approximately 10 minutes, such as 10 minutes, 10 minutes 15 seconds, 9 minutes 58 seconds, 10 minutes 12 seconds, etc.

For example, when the control device 300 calls the transport vehicle 200 in response to each article transport request signal generated by the first substrate treatment apparatus AP-A, one of the transport vehicles 200 may be selected. A time taken for the selected one to reach the first substrate treatment apparatus AP-A may be approximately 5 minutes, such as 5 minutes, 5 minutes 3 seconds, 4 minutes 35 seconds, 4 minutes 59 seconds, etc.

For example, when the control device 300 calls the transport vehicle 200, the moving distance by which the selected one of the transport vehicles 200 moves to arrive at the first substrate treatment apparatus AP-A may be about 50 m, such as 50 m, 52 m, 48 m, 51 m, etc.

That is, the data such as the transport request time-interval, the arrival consumption time, and the movement distance are continuously collected and stored in the control device 300.

Further, step S11 may be performed for a set period. The set period may be specified as various values such as a month, a week, a day, a few hours, or a few minutes. When the data has been collected for the set period, the control device 300 may derive a predicted value of each of the transport request time-interval, the arrival consumption time, and the movement distance using the stored data.

In steps S12, S13, and S14, probability distribution fitting on the data collected in step S11 may be performed. The probability distribution fitting may mean approximating the data collected as certain values in a form of a nonlinear function. Via the probability distribution fitting, the transport request time-interval of the substrate treatment apparatus AP that may occur at the highest probability, the arrival consumption time of the transport vehicle 200 to the substrate treatment apparatus AP that may occur at the highest probability, and the movement distance by which the transport vehicle 200 moves to arrive at the substrate treatment apparatus AP which may occur at the highest probability may be derived.

For example, the transport request time-interval of the substrate treatment apparatus AP that may occur at the highest probability, the arrival consumption time of the transport vehicle 200 to the substrate treatment apparatus AP that may occur at the highest probability, and the movement distance by which the transport vehicle 200 moves to arrive at the substrate treatment apparatus AP which may occur at the highest probability may be representative values of the data.

For example, the transport request time-interval of the first substrate treatment apparatus AP-A that may occur at the highest probability may be an average value T of the transport request time-intervals of the first substrate treatment apparatus AP-A collected while step S11 is performed.

Further, the arrival consumption time of the transport vehicle 200 to the substrate treatment apparatus AP, which may occur at the highest probability may be an average value $\Delta t$ of times taken for the selected transport vehicle among the transport vehicle 200 to arrive at the first substrate treatment apparatus AP-A.

Further, the movement distance by which the transport vehicle 200 moves to arrive at the substrate treatment apparatus AP which may occur at the highest probability may be an average value d of movement distances by which the selected transport vehicle 200 moves to arrive at the first substrate treatment apparatus AP-A.

In the above example, a case in which step S11 is performed for the set period, and then, steps S12, S13, and S14 are performed is described by way of example. However, the inventive concept is not limited thereto. For example, steps S12, S13, and S14 may be performed in real time while step S11 is being performed. In addition, based on the data accumulated in real time for the set period, an average value as described below may be added to the operation data on the set period basis.

In steps S15, S16, and S17, the representative values of the collected data may be added to the operation data.

The operation data may include a set $M_T$ of average values T of the transport request time-interval, a set $M_{At}$ of average values $\Delta t$ of the transport vehicle arrival consumption time, and a set $M_d$ of average values d of the transport vehicle movement distance.

For example, $M_T$ may include $T_1, T_2 \ldots T_n$. An average value of transport request time-intervals collected for a first period may be referred to as $T_1$, an average value of transport request time-intervals collected for a second period may be referred to as $T_2$, and an average value of transport request time-interval collected for an n-th period may be referred to as $T_n$. In this regard, as a number value of a subscript is smaller, a corresponding average value thereto may be a representative value added to the operation data, based on the data collected more recently. For example, $T_1$ may be a representative value most recently added to the operation data, based on the most recently collected data.

Further, $M_{\Delta t}$ may include $\Delta t_1$, $\Delta t_2$ . . . $\Delta t_n$. An average value of the arrival consumption times required for the selected transport vehicle 200 among the transport vehicle 200 to arrive at the substrate treatment apparatus AP as collected for the first period may be referred to as $\Delta t_1$. An average value of the arrival consumption times required for the selected transport vehicle 200 among the transport vehicle 200 to arrive at the substrate treatment apparatus AP as collected for the second period may be referred to as $\Delta t_2$. An average value of the arrival consumption times required for the selected transport vehicle 200 among the transport vehicle 200 to arrive at the substrate treatment apparatus AP as collected for the n-th period may be referred to as $\Delta t_n$. In this regard, as a number value of a subscript is smaller, a corresponding average value thereto may be a representative value added to the operation data, based on the data collected more recently. For example, $\Delta t_1$ may be a representative value most recently added to the operation data, based on the most recently collected data.

Further, $M_d$ may include $d_1$, $d_2$ . . . $d_n$. An average value of the moving distances by which the selected transport vehicle 200 moves to arrive at the substrate treatment apparatus AP as collected for the first period may be referred to as $d_1$. An average value of the moving distances by which the selected transport vehicle 200 moves to arrive at the substrate treatment apparatus AP as collected for the second period may be referred to as $d_2$. An average value of the moving distances by which the selected transport vehicle 200 moves to arrive at the substrate treatment apparatus AP as collected for the n-th period may be referred to as $d_n$. In this regard, as a number value of a subscript is smaller, a corresponding average value thereto may be a representative value added to the operation data, based on the data collected more recently. For example, $d_1$ may be a representative value most recently added to the operation data, based on the most recently collected data.

The control device 300 may store the operation data therein. The control device 300 may calculate and derive the predicted transport request time-point of the substrate treatment apparatus AP and the transport vehicle in-advance calling time-point, based on pre-collected and pre-stored operation data.

FIG. 8 is a flow chart for illustrating the in-advance calling time-point calculation step of FIG. 6.

Referring to FIG. 1, FIG. 6 and FIG. 8, a transport request time-interval is predicted in step S21. For example, the predicted transport request time-interval of the first substrate treatment apparatus AP-A may be predicted. More specifically, the aforementioned $T_1$, $T_2$, . . . , $T_n$ are pre-stored in the operation data. $T_1$ is the average value of the transport request time-intervals added based on the most recently collected data. The most recently collected data best reflects a state of the article transport system 10 and a state of the substrate treatment apparatuses AP. Thus, a larger weight may be applied to the average value of the most recently added transport request time-intervals based on the most recently collected data, such that the predicted transport time-interval $T_F$ may be derived For example, the predicted transport time-interval $T_F$ may be obtained based on Equation 1 as follows:

$$T_F = \alpha_T {}^* T_1 + \beta_T {}^* T_2 + \qquad \text{[Equation 1]}$$

$$\{\text{where, } \alpha_T + \beta_T + \ldots = 1\}$$

In step S22, the time required for the transport vehicle 200 selected from among the transport vehicles 200 to arrive at the substrate treatment apparatus AP is predicted. For example, the time required for the selected transport vehicle 200 receiving a calling signal from the control device 300 among the transport vehicles 200 to arrive at the first substrate treatment apparatus AP-A may be predicted. More specifically, the aforementioned $\Delta t_1$, $\Delta t_2$, . . . , $\Delta t_n$ are pre-stored in the operation data. $\Delta t_1$ is the average value of the transport request time-intervals added based on the most recently collected data. The most recently collected data best reflects the state of the article transport system 10 and the state of the substrate treatment apparatuses AP. Thus, a larger weight may be applied to the average value of the most recently added arrival consumption times based on the most recently collected data, such that the predicted arrival consumption time $\Delta t_F$ may be derived.

For example, the predicted arrival consumption time $\Delta t_F$ may be obtained based on Equation 2 as follows:

$$\Delta t_F = \alpha_t {}^* \Delta t_1 + \beta_t {}^* \Delta t_2 + \qquad \text{[Equation 2]}$$

$$\{\text{where, } \alpha_t + \beta_t + \ldots = 1\}$$

In step S23, the movement distance of the transport vehicle 200 is predicted. For example, when the first substrate treatment apparatus AP-A generates the transport request signal, the moving distance by which the selected transport vehicle 200 among the transport vehicles 200 moves to arrive at the first substrate treatment apparatus AP-A may be predicted. More specifically, the aforementioned $d_1$, $d_2$, . . . , $d_n$ are pre-stored in the operation data. $d_1$ is the average value of the movement distances added based on the most recently collected data. The most recently collected data best reflects the state of the article transport system 10 and the state of the substrate treatment apparatuses AP. Thus, a larger weight may be applied to the average value of the most recently added movement distances based on the most recently collected data, such that the predicted movement distance $d_F$ may be derived.

For example, the predicted movement distance $d_F$ may be obtained based on Equation 3 as follows:

$$d_F = \alpha_d {}^* d_1 + \beta_d {}^* d_2 + \qquad \text{[Equation 3]}$$

$$\{\text{where, } \alpha_d + \beta_d + \ldots = 1\}$$

In step S24, the transport request time-point of the substrate treatment apparatus AP may be predicted using the predicted transport request time-interval $T_F$ obtained in steps S21, S22, and S23 as described above. For example, when the actual transport request of the first substrate treatment apparatus AP-A occurs at $t_0$, a next transport request time-point (the predicted transport request time-point) $t_p$ may be derived based on Equation 4 as follows:

$$t_p = t_0 + T_F \qquad \text{[Equation 4]}$$

In step S25, the in-advance calling time point $t_{next}$ of the transport vehicle may be derived from the predicted transport request time-point $t_p$. The in-advance calling time-point $t_{next}$ may be a time-point later than the actual transport request time-point $t_0$ and earlier than the predicted transport request time-point $t_p$. The in-advance calling time point $t_{next}$ may be derived based on Equation 5 as follows:

$$t_{next} = t_p - \Delta t_F \qquad \text{[Equation 5]}$$

In one example, when necessary, the in-advance calling time-point $t_{next}$ may be specified as a time-point earlier by a set time than a time-point obtained by subtracting the predicted arrival consumption time $\Delta t_F$ from the predicted transport request time-point $t_p$. The set time may be preset to a value from 5 seconds to 30 seconds. When the in-advance calling time-point $t_{next}$ is specified as the time-point earlier by the set time than the time-point obtained by subtracting the predicted arrival consumption time $\Delta t_F$ from the pre-dicted transport request time-point $t_p$, the control device 300 may check whether the substrate treatment apparatus AP generates an actual transport request signal while the trans-port vehicle 200 is travelling toward the substrate treatment apparatus AP. When the actual transport request signal is not generated, the control device 300 may cancel the calling of the transport vehicle 200, thus providing an advantage in terms of the operation of the transport vehicle 200.

Referring to FIG. 1 and FIG. 6 again, in in-advance calling execution/non-execution determination step S30, it may be determined whether to proceed with in-advance calling of the transport vehicle 200. Specifically, whether to proceed with the in-advance calling of the transport vehicle 200 may be determined based on whether the in-advance calling time-point $t_{next}$ as previously derived has passed or not passed a current time point $t_{cur}$. When the in-advance calling time-point $t_{next}$ does not pass the current time-point $t_{cur}$, transport step S40 may be performed based on the first transport model PM. When the in-advance calling time-point $t_{next}$ passes the current time point $t_{cur}$, transport step S40 may be performed based on the second transport model BM.

In transport step S40, the transport vehicle 200 may perform article transport based on a transport model selected based on whether to proceed with in-advance calling. The model applicable to the transport step S40 may include the first transport model PM and the second transport model BM. The first transport model PM may be a prediction model selected when the in-advance calling is executed. The second transport model BM may be a basic model selected when the in-advance calling is not executed. The data (e.g., the transport request time-interval, the arrival consumption time, the movement distance, etc.) about the article transport performed in transport step S40 may be collected by the control device 300.

Figure 9:
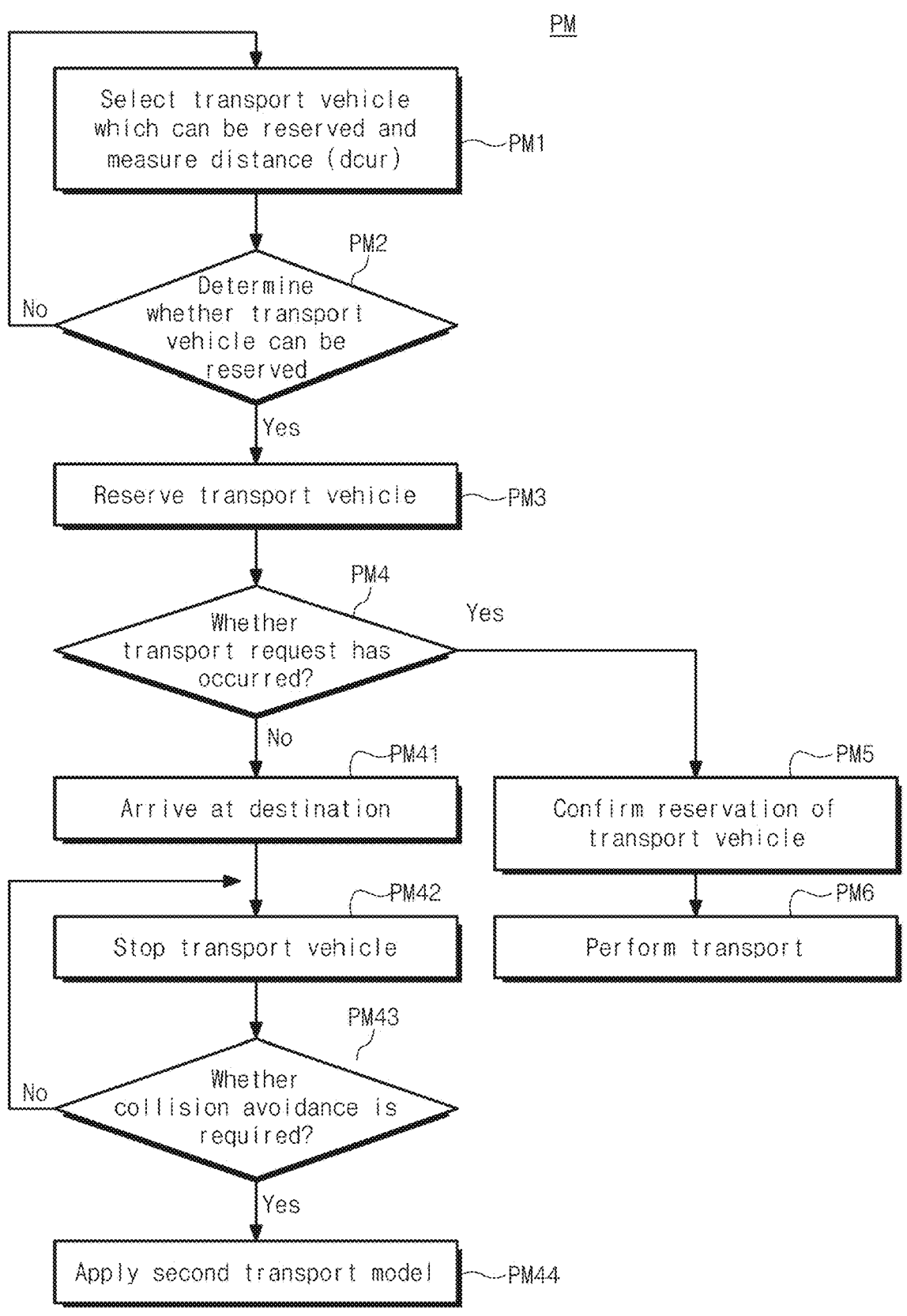
FIG. 9 is a flow chart for illustrating a first transport model of FIG. 6.

FIG. 9 is a flow chart for illustrating the first transport model of FIG. 6.

Referring to FIG. 1, FIG. 6, and FIG. 9, the first transport model PM may be an algorithm pre-stored in the control device 300 to which the prediction model is applied. In step PM1, the transport vehicle 200 which can be reserved may be selected, and an actual distance $d_{cur}$ between the selected transport vehicle 200 and the substrate treatment apparatus AP may be measured.

In step PM2, it may be determined whether the transport vehicle 200 can be reserved using a ratio between the predicted movement distance $d_F$ and the actual distance $d_{cur}$. For example, whether the transport vehicle 200 can be reserved may be determined based on Equation 6 as follows:

$$t_{cur} < t_p - d_{cur}/d_F * \Delta t_F \qquad \text{[Equation 6]}$$

$t_{cur}$ may be the current time-point, $t_p$ may be the predicted transport request time-point, $d_{cur}$ may be the distance between the selected transport vehicle 200 and the substrate treatment apparatus AP that has generated the transport request signal, and $\Delta t_F$ may be the predicted arrival con-sumption time of the selected transport vehicle 200. $[t_p - d_{cur}/d_F * \Delta t_F]$ may be the in-advance calling time-point applied to the selected transport vehicle 200.

When $d_{cur}$ is too large (that is, when the distance between the selected transport vehicle 200 and the substrate treatment apparatus AP which has generated the transport request signal is too large), it may take too much time for the selected transport vehicle 200 to arrive at the substrate treatment apparatus AP.

For example, the twelfth transport vehicle 200L has been selected as a transport vehicle to transport the article to the first substrate treatment apparatus AP-A. However, because the twelfth transport vehicle 200L is too far from the first substrate treatment apparatus AP-A, the twelfth transport vehicle 200L may not be suitable as the transport vehicle 200 to transport the article to the first substrate treatment apparatus AP-A. That is, an in-advance calling time-point applied to the selected twelfth transport vehicle 200L is derived. When the derived in-advance calling time-point passes the current time-point $t_{cur}$, it is determined that the twelfth transport vehicle 200L is the transport vehicle 200 which cannot be reserved. Thus, another transport vehicle 200 is selected.

For example, the first transport vehicle 200A has been selected as the vehicle to transport the article to the first substrate treatment apparatus AP-A. Because the first trans-port vehicle 200A is located adjacent to the first substrate treatment apparatus AP-A, the first transport vehicle 200A may be suitable as the transport vehicle 200 to transport the article to the first substrate treatment apparatus AP-A. That is, an in-advance calling time-point applied to the selected first transport vehicle 200A is derived. When the derived in-advance calling time-point does not pass the current time-point $t_{cur}$, the first transport vehicle 200A is determined to be a transport vehicle that can be reserved.

In step PM3, a temporary reservation is made on the transport vehicle 200 that can be reserved. When the tem-porary reservation is made, the control device 300 may transmit a calling signal to the reserved transport vehicle 200. Upon receiving the calling signal, the transport vehicle 200 may move toward the substrate treatment apparatus AP to perform a transport task. For example, when it is deter-mined that the first transport vehicle 200A is the transport vehicle 200 that can be reserved, the temporary reservation is made on the first transport vehicle 200A. The reserved first transport vehicle 200A may move toward the first substrate treatment apparatus AP-A to perform a transport task.

In step PM4, it is determined whether an actual transport request of the substrate treatment apparatus AP has occurred while the transport vehicle 200 is moving to the substrate treatment apparatus AP to perform the transport task (or in some cases, when the movement is completed).

When the actual transport request has occurred, transport reservation on the corresponding transport vehicle 200 is confirmed in step PM5, and the transport vehicle 200 performs actual transport in step PM6. For example, when the first substrate treatment apparatus AP-A has generated an actual article transport request signal while the first transport vehicle 200A is moving to the first substrate treatment apparatus AP-A in order to perform the transport task to the first substrate treatment apparatus AP-A, the control device 300 confirms reservation on the first transport vehicle 200A, and then the first transport vehicle 200A performs actual transport.

In other words, the predicted transport request time-point $t_p$ is only a predicted time-point. Thus, when the actual transport request signal of the substrate treatment apparatus AP does not occur, the transport vehicle 200 does not perform a transport operation such as unloading the article or collecting the article.

When the actual transport request does not occur, the transport vehicle 200 arrives at the substrate treatment apparatus AP as a destination in step PM41. For example, the first transport vehicle 200A may arrive at a position above the first substrate treatment apparatus AP-A.

In step PM42, the transport vehicle 200 waits at a position above the substrate treatment apparatus AP until the substrate treatment apparatus AP generates an actual article transport request signal. For example, the first transport vehicle 200A waits until the actual transport request signal of the first substrate treatment apparatus AP-A is generated.

In step PM43, while the transport vehicle 200 is waiting at the position above the substrate treatment apparatus AP, whether collision avoidance is necessary is continuously checked. When the collision avoidance is not required, the transport vehicle 200 waits at the position above the substrate treatment apparatus AP.

On the contrary, when the collision avoidance is necessary, the temporary reservation on the transport vehicle 200 may be canceled, and the transport vehicle 200 may be reserved based on the second transport model BM according to step PM44. For example, while the first transport vehicle 200A is waiting at the position above the first substrate treatment apparatus AP-A, a transport task of the second transport vehicle 200B may be performed, and a travel path along which the second transport vehicle 200B travels in order to perform the transport task may overlap the position at which the first transport vehicle 200A waits. In this case, it may be determined that collision avoidance is necessary. In this case, the temporary reservation on the first transport vehicle 200A may be canceled, and task assignment to the transport vehicle 200 may be executed based on the second transport model BM.

Figure 10:
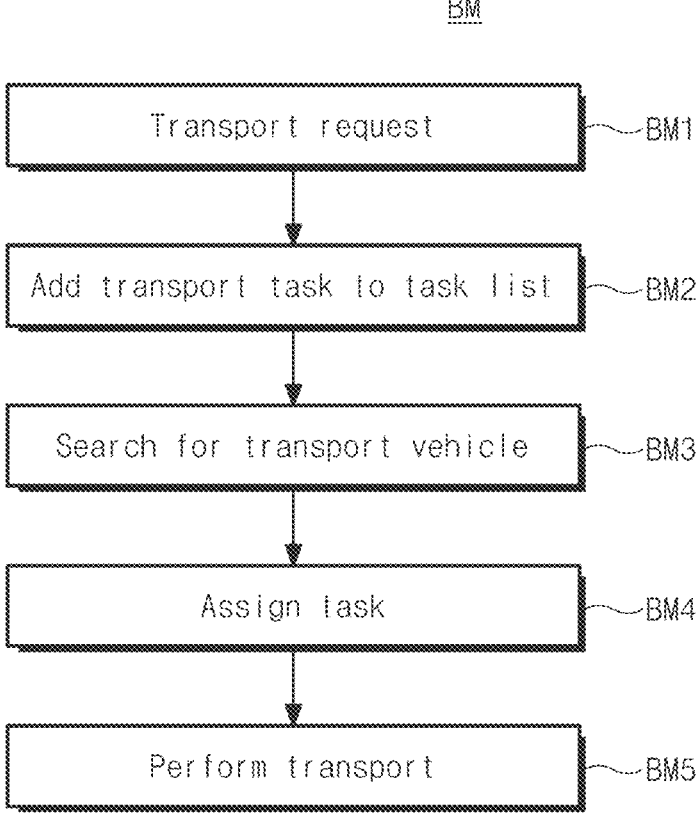
FIG. 10 is a flow chart for illustrating a second transport model of FIG. 6.

FIG. 10 is a flow chart for illustrating the second transport model of FIG. 6.

Referring to FIG. 1, FIG. 6, and FIG. 10, the second transport model BM may be a different model from the first transport model PM. The second transport model BM may be a basic model to which the prediction model is not applied. The second transport model BM may be an algorithm pre-stored in the control device 300 to which the prediction model is not applied.

In step BM1, the substrate treatment apparatus AP may generate a transport request signal of an actual article.

In step BM2, the control device 300 may add a transport task related to the substrate treatment apparatus AP to the task list.

In step BM3, the transport vehicle 200 to perform the task added to a task list may be searched for.

In step BM4, when the found transport vehicle 200 is suitable for performing the task, the control device 300 may allocate the transport task to the corresponding transport vehicle 200. Whether the found transport vehicle 200 is suitable for carrying out the transport task may be determined in consideration of the distance between the transport vehicle 200 and the substrate treatment apparatus AP that has generated the transport request signal, the type and quantity of articles in the container C held by the transport vehicle 200, etc.

In step BM5, the transport vehicle 200 to which transport task has been assigned may perform transport.

The second transport model BM may be selected when it is determined that in-advance calling is not performed in the in-advance calling execution/non-execution determination step S30, or when it is determined that the collision avoidance is necessary in step PM43 of the first transport model PM.

As described above, according to one embodiment of the inventive concept, before the actual article transport request signal is generated from the substrate treatment apparatus AP, the transport vehicle 200 is called in advance and moves toward the substrate treatment apparatus AP. That is, the method of operating the article transport system 10 according to one embodiment of the inventive concept is proactive and active. According to the operation method according to one embodiment of the inventive concept, the efficiency of the article transport by the transport vehicle 200 may be improved. Because article transport may be completed at substantially the same time-point as the time-point at which the article transport request signal is generated from the substrate treatment apparatus AP, the entire time required for the transport of the article may be reduced.

According to one embodiment of the inventive concept, the article may be effectively transported.

Further, according to an embodiment of the inventive concept, the time required for article transport may be shortened.

Further, according to an embodiment of the inventive concept, the transport request time-point of the target apparatus in the article transport may be predicted and thus the transport vehicle may be proactively and actively controlled based on the predicted transport request time-point.

Further, according to an embodiment of the inventive concept, the operation time of the target apparatus may be improved by minimizing the time required for article transport.

The effect of the inventive concept is not limited to the above-mentioned effects. The effects as not mentioned may be clearly understood by those skilled in the art from the above disclosure and the accompanying drawings.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of operating an article transport system, the method comprising:

deriving a predicted transport request time-point of a target apparatus from collected operation data of the article transport system;

calling a first transport vehicle of the article transport system at a time-point prior to the predicted transport request time-point; and moving the first transport vehicle to the target apparatus in response to the calling.

2. The method of claim 1, further comprising:

deriving a predicted first time for the first transport vehicle to arrive at the target apparatus, based on the operation data; and deriving a transport vehicle in-advance calling time-point at which the calling of the first transport vehicle is performed, based on the predicted transport request time-point and the predicted first time.

3. The method of claim 2, wherein the transport vehicle in-advance calling time-point is equal to or earlier than a time-point obtained by subtracting the predicted first time from the predicted transport request time-point.

4. The method of claim 2, wherein the method further comprising:

collecting first data while the article transport system operates for a set period to obtain collected first data, wherein the first data include, a collected transport request time-interval of the target apparatus, a collected second time for a selected transport vehicle to arrive at the target apparatus based on the selected transport vehicle being called, or a collected movement distance by which the selected transport vehicle moves to the target apparatus based on the selected transport vehicle being called.

5. The method of claim 4, further comprising:

adding representative values of the collected first data to the operation data.

6. The method of claim 5, further comprising:

applying a weight to each of the representative values in the operation data to derive a predicted transport request time-interval of the first transport vehicle, a predicted second time, or a predicted movement distance of the first transport vehicle.

7. The method of claim 6, wherein a larger magnitude of the weight is applied to a representative value more recently added to the operation data among the representative values.

8. The method of claim 7, wherein the applying of the weight to each of the representative values obtains a plurality of weights; and a sum of the plurality of weights is 1.

9. The method of claim 1, wherein the predicted transport request time-point is a prediction of a time-point at which the target apparatus will request article transport.

10. A method of operating an article transport system, the article transport system including a rail and transport vehicles, the rail being installed above a substrate treatment apparatus, the transport vehicles being configured to travel along the rail and transport an article to the substrate treatment apparatus, and the method comprising:

collecting operation data while the article transport system operates;

deriving a predicted transport request time-point of the substrate treatment apparatus based on the operation data; and deriving an in-advance calling time-point of a first transport vehicle among the transport vehicles, the in-advance calling time-point being earlier than the predicted transport request time-point.

11. The method of claim 10, further comprising:

deriving a predicted transport time-interval of the substrate treatment apparatus based on the operation data; and deriving the predicted transport request time-point by adding the predicted transport time-interval to a first transport request time-point.

12. The method of claim 11, further comprising:

deriving a predicted first time and a predicted movement distance based on the operation data, the predicted first time being a time for the first transport vehicle to arrive at the substrate treatment apparatus, and the predicted movement distance being a distance by which the first transport vehicle moves to arrive at the substrate treatment apparatus; and designating, as the in-advance calling time-point, a time-point equal to or earlier than a time-point obtained by subtracting the predicted first time from the predicted transport request time-point.

13. The method of claim 12, further comprising:

determining whether the in-advance calling time-point has passed a current time-point to obtain a determining result; and determining whether to proceed with in-advance calling of the first transport vehicle based on the determining result.

14. The method of claim 13, further comprising:

transporting the article using a transport model selected from among a first transport model and a second transport model based on the determining whether to proceed with in-advance calling, the second transport model being different from the first transport model.

15. The method of claim 14, wherein the transporting includes transporting the article based on the first transport model in response to determining the in-advance calling time-point as not passed the current time-point; and the first transport model includes:

selecting one of the transport vehicles to obtain a selected transport vehicle, measuring a distance between the selected transport vehicle and the substrate treatment apparatus to obtain a measured distance, and determine whether to reserve the selected transport vehicle reserved based on the measured distance.

16. The method of claim 15, wherein the first transport model includes determining whether to reserve the selected transport vehicle based on a ratio between the measured distance and the predicted movement distance.

17. The method of claim 16, wherein the first transport model includes:

confirming reservation of the selected transport vehicle based on occurrence of a transport request of the substrate treatment apparatus occurs while the selected transport vehicle is moving to the substrate treatment apparatus; and performing the transporting using the selected transport vehicle.

18. The method of claim 16, wherein the first transport model includes causing the selected transport vehicle to wait at a position above the substrate treatment apparatus based on nonoccurrence of a transport request of the substrate treatment apparatus while the selected transport vehicle is moving to the substrate treatment apparatus.

19. The method of claim 18, further comprising:

applying the second transport model to call another transport vehicle based on a determination to perform collision avoidance while the selected transport vehicle is waiting at the position above the substrate treatment apparatus.

20. The method of claim 14, wherein the second transport model includes:

searching for the first transport vehicle based on the first transport vehicle being capable of performing a transport request of the substrate treatment apparatus in response to the transport request;

assigning a task to the first transport vehicle based on the searching; and causing the first transport vehicle to perform the transporting based on the assigning.

\* \* \* \* \*